Figure 1:
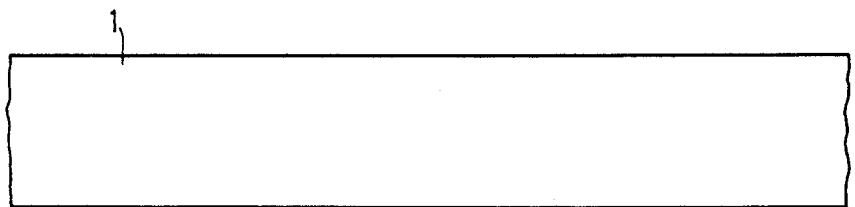

United States Patent [19]

Alexander et al.

[11] Patent Number: 4,971,925
[45] Date of Patent: Nov. 20, 1990

[54] IMPROVED METHOD OF MANUFACTURING A SEMICONDUCTOR DEVICE OF THE "SEMICONDUCTOR ON INSULATOR" TYPE

[75] Inventors: Elizabeth M. L. Alexander; Jan Haisma; Theodorus Michielsen; Johannes Van Der Velden; Johannes F. C. M. Verhoeven, all of Eindhoven, Netherlands

[73] Assignee: U.S. Philips Corporation, New York, N.Y.

[21] Appl. No.: 142,763

[22] Filed: Jan. 11, 1988

[30] Foreign Application Priority Data

Jan. 9, 1987 [NL] Netherlands ............... 8700033

[51] Int. Cl.$^5$ ............................................. H01L 21/76
[52] U.S. Cl. ......................................... 437/62; 437/51; 437/915; 148/DIG. 164; 148/DIG. 135
[58] Field of Search ............... 437/62, 67, 68, 912, 437/51; 148/DIG. 12, DIG. 164, DIG. 135

[56] References Cited

U.S. PATENT DOCUMENTS

| | | | |
|---|---|---|---|
| 3,508,980 | 4/1970 | Jackson, Jr. et al. | 437/62 |
| 3,689,357 | 9/1972 | Jordan | 437/62 |
| 3,911,562 | 10/1975 | Youmans | 437/62 |
| 3,938,176 | 2/1976 | Sloan | 437/51 |
| 4,501,060 | 2/1985 | Frye et al. | 437/62 |
| 4,735,679 | 4/1988 | Lasky | 437/62 |
| 4,784,970 | 11/1988 | Solomon | 437/62 |
| 4,794,092 | 12/1988 | Solomon | 437/51 |
| 4,851,078 | 7/1989 | Short | 437/62 |

FOREIGN PATENT DOCUMENTS 0213299 3/1987 European Pat. Off. .

OTHER PUBLICATIONS

Frye et al., J. Electrochem. Soc.; Solid-State Science and Technology, vol. 133, No. 8, (Aug. 1986), pp. 1673–1677.
Healy, IBM Tech. Disc. Bull., vol. 8, No. 7, (Dec. 1965), pp. 1016–1017.
Krull et al., IEEE Circuits and Devices Magazine (Jul. 1987), pp. 20–25.
Broadie et al., IBM Tech. Disc. Bull., vol. 16, No. 9, (Feb. 1974), pp. 2869–2870.

Primary Examiner—Olik Chaudhuri
Attorney, Agent, or Firm—Paul R. Miller

[57] ABSTRACT

In a method of manufacturing a semiconductor device of the "semiconductor on insulator" type comprising at least one carrier body and a monocrystalline semiconductor body, in a major surface (2) of a monocrystalline semiconductor body (1) grooves (3) are provided having a predetermined depth. The surface provided with grooves is coated with a layer (4) of material resistant to polishing; and this layer is coated with a layer (5) of a chemomechanically polishable material having a layer thickness exceeding the groove depth, the latter layer (5) being polished to flatness and smoothness. The polished surface of the semiconductor body (1) is connected to a smooth flat major surface of a carrier body (6). Subsequently, the semiconductor body (1) is made thin, at least the last part of this operation consisting of a polishing step, which terminates on the layer (4) of material resistant to polishing so that mutually insulated "semiconductor an insulator" regions are obtained, the thickness of the semiconductor regions being equal to the depth of the grooves.

11 Claims, 2 Drawing Sheets

IMPROVED METHOD OF MANUFACTURING A SEMICONDUCTOR DEVICE OF THE "SEMICONDUCTOR ON INSULATOR" TYPE

The invention relates to a method of manufacturing a semiconductor device of the "semiconductor on insulator" type comprising at least one carrier body and a monocrystalline semiconductor body, both bodies being provided with at least one flat optically smooth surface, the flat surfaces of the two bodies being brought into contact with each other and being interconnected, while at least one of the interconnected surfaces has an electrically insulating layer, after which the semiconductor body is made thin by removing material to a predetermined value.

Such a method is known from "Applied Physics Letters", Vol. 43, No. 3, Aug. 1983, p. 263–265. In this known method, the semiconductor body is made thin by means of electrochemical thin-etching. The etchants used for this purpose generally comprise hydrofluoride as one of the constituents. These HF-containing etchants attack not only the silicon frequently used as semiconductor material, but also the silicon dioxide frequently used as insulator. Moreover, parts of the semiconductor body subjected to mechanical stress can be preferentially attacked by such etchants. Furthermore, chemical etchants must be treated with great care in order to avoid environmental pollution. If further insulated regions should be obtained in the thin-etched semiconductor layer, a number of further processing steps must be carried out in the known method.

The invention has for its object to provide a method of the kind mentioned in the opening paragraph, in which disadvantanges inherent in electrochemical etching are avoided, in which the layer thickness of the thin-etched semiconductor body is controlled accurately and in which simultaneously mutually insulated regions can be obtained in the thin semiconductor layer without further complicated processing steps being required.

In order to achieve this end, in the method according to the invention, grooves having a depth equal to the desired value of the layer to be made thin are provided in a surface of the monocrystalline semiconductor body, the surface provided with grooves is coated with a layer of material resistant to polishing, the latter layer is coated with a layer of a material which can be polished chemo-mechanically and has a layer thickness exceeding the groove depth, the layer being polished to smoothness and flatness, after which the polished surface of the semiconductor body is connected to the smooth flat surface of the carrier body, and the semiconductor body is then made thin, at least the last part of this operation consisting of a polishing operation terminating on the layer of material resistant to polishing. Thus, a "semiconductor on insulator" is obtained, in which very reproducible and a thin semiconductor layer is obtained, which is subdivided into a plurality of insulated regions.

In a preferred embodiment of a method according to the invention, the operation of polishing to flatness the chemomechanically polishable material applied to the surface provided with grooves of the semiconductor body is continued down to the layer of material resistant to polishing. The thickness of the semiconductor layer on the insulator is then determined exactly because both before and after the semiconductor body is connected to the carrier body a polishing operation is carried out, which terminates on the layer resistant to polishing, which is formed in the surface provided with grooves.

The layer resistant to polishing may preferably consist of silicon nitride ($Si_3N_4$) or of a densified silicon dioxide ($SiO_2$).

Figure 2:
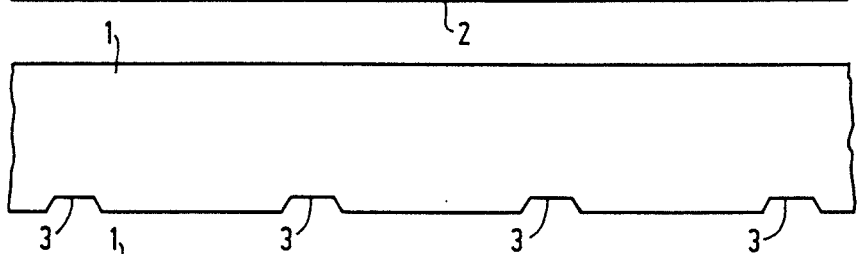
Figure 3:
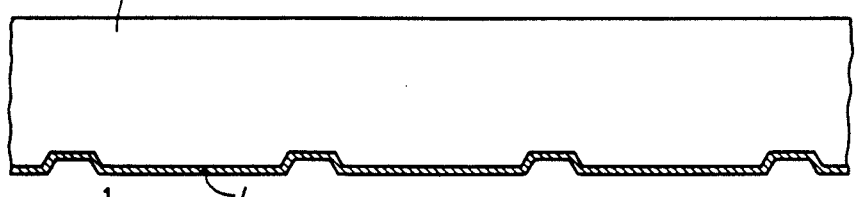
Figure 4:
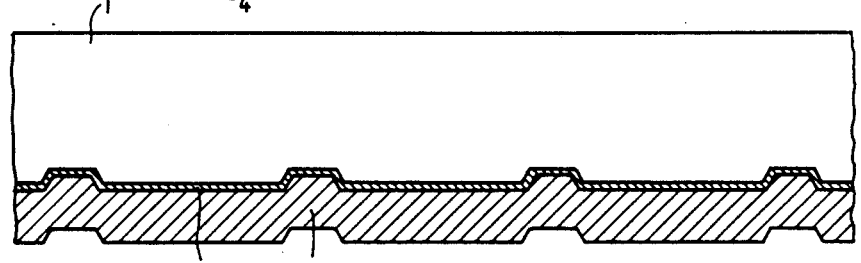
Figure 5:
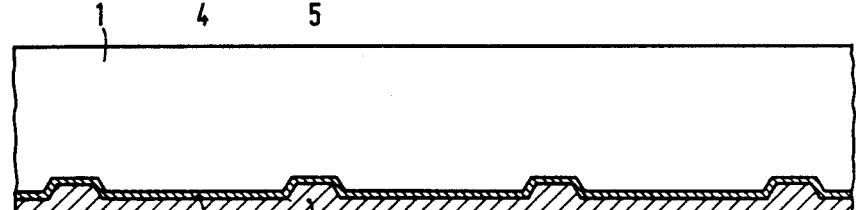
Figure 6:
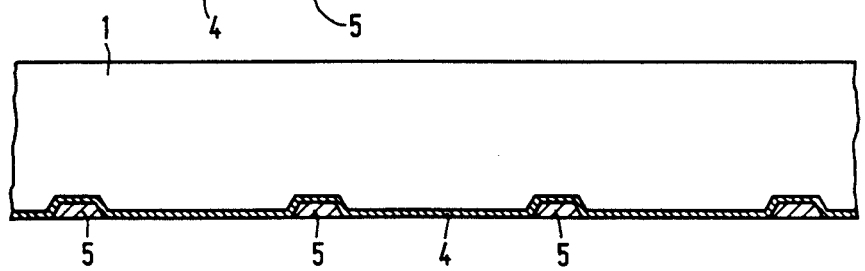
Figure 7:
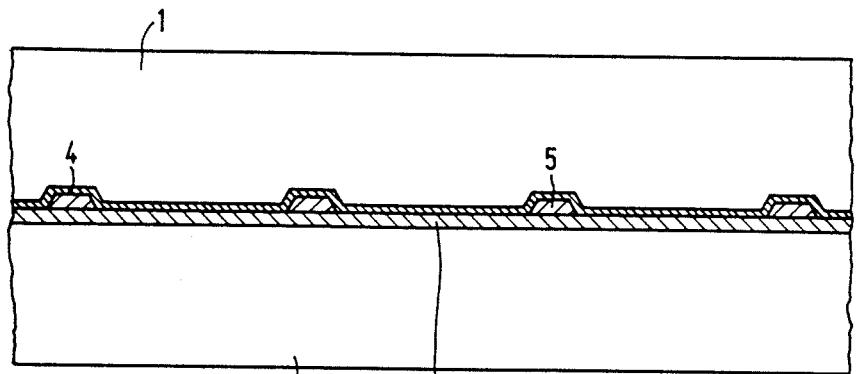
Figure 8:
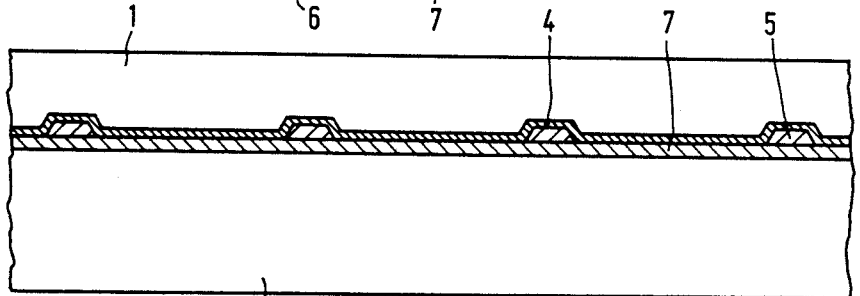
Figure 9:
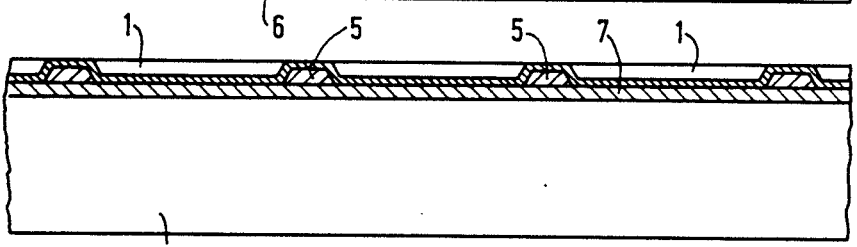
Figure 10:
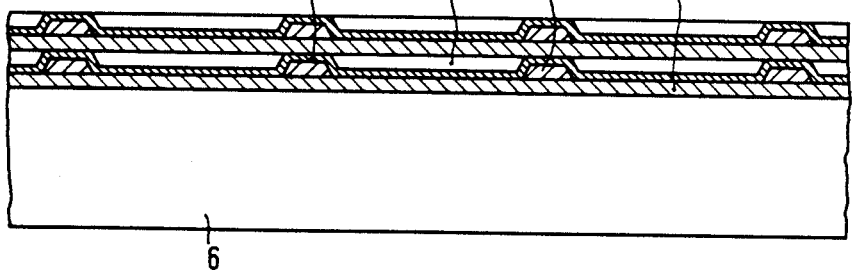

The chemomechanically polishable material can consist according to the invention of an undensified silicon dioxide. Other materials, such as polycrystalline silicon, are also suitable. In the latter case, a layer of a densified silicon dioxide resistant to polishing may be provided between the layer of polycrystalline silicon and the layer resistant to polishing of silicon nitride. An insulating layer of very high quality is then obtained. The semiconductor device obtained by means of the method according to the invention is particularly suitable for forming a tridimensional IC structure. For this purpose, according to the invention, IC structures are provided in a thin semiconductor layer, as a result of which the surface exhibits embossed parts, while chemomechanically polishable material is deposited on the surface, this material being planarized, for example, by means of polishing, until an insulating layer of small thickness is present above the semiconductor structures, this assembly being a first register which forms the carrier body, on which a second semiconductor body is provided in the manner indicated in claim 1, the thin semiconductor layer of IC structures forming a second register and any further analogous steps being carrier out for forming a tridimensional stack of IC's. The invention will be described more fully with reference to the drawing. In the drawing:

FIG. 1 shows a semiconductor body provided with at least one flat and smooth major surface, FIG. 2 shows the semiconductor body provided with grooves, FIG. 3 shows the semiconductor body coated with a layer resistant to polishing, FIG. 4 shows the semiconductor body of FIG. 3, on which a layer of a polishable material is provided, FIG. 5 shows the semiconductor body of FIG. 4, the layer of polishable material being polished to flatness and smoothness, FIG. 6 shows the semiconductor body of FIG. 4, the operation of polishing to flatness and smoothness being continued down to the layer resistant to polishing, FIG. 7 shows the semiconductor body of FIG. 6 connected to a carrier body, FIG. 8 shows the combination of FIG. 7, in which the semiconductor body is made thinner, FIG. 9 shows the combination of FIG. 8, in which the thinning operation is terminated by a stopping polishing down to the layer resistant to polishing, and FIG. 10 shows a tridimensional stack of IC's.

The method of obtaining a "semiconductor on insulator" is shown in steps in FIGS. 1 to 9. FIG. 1 shows a semiconductor body 1, of which at least the major surface 2 is made flat and smooth. Grooves 3 are provided in the semiconductor body, which consists, for example, of silicon, at the area of the major surface 2, for example by means of etching. The depth of these grooves depends upon the desired layer thickness of the ultimate semiconductor layer on the "semiconductor on insulator" to be formed. The grooves 3 are covered by a layer 4 resistant to polishing of an insulating material (cf. FIG. 3). The material of the layer 4 may be silicon nitride ($Si_3N_4$); other suitable materials may also be used, such as a densified silicon dioxide obtained by deposition from tetra-ethyl orhosilicate (TEOS) and a subsequent annealing treatment. The thickness of the layer 4 is preferably a few hundreds of nanometres.

The semiconductor wafer thus prepared is coated on the surface provided with grooves with a chemomechanically polishable material 5 having a layer thickness larger than the depth of the grooves 3. The layer 5 shown in FIG. 4 may consist of polycrystalline silicon, which is applied, for example, by means of LPCVD (Low Pressure Chemical Vapour Deposition). Another suitable material is an undensified silicon dioxide obtained by deposition from tetraethyl orthosilicate (TEOS). This layer 5 is polished to flatness chemomechanically. This operation can be continued until a layer of polishable material is still present on the whole major surface 2 (cf. FIG. 5), or the polishing treatment is continued down to the layer 4 resistant to polishing, indicated by stopping polishing (cf. FIG. 6). This chemomechanical polishing operation is a polishing operation, in which use is made, for example, of colloidal silicon dioxide in an alkaline solution with an oxidant, such as, for example, the polishing agent marketed under the tradename of Syton W 30 by Monsanto.

In order to form a "semiconductor on insulator", the semiconductor body is now secured on a carrier body. FIG. 7 shows the semiconductor body of FIG. 6 connected to a carrier body 6. The carrier body shown is formed from monocrystalline silicon, of which a major surface is provided with an insulating layer 7 of thermally grown silicon dioxide having a thickness of, for example, 1/μm. Another material, for example quartz glass, may also be chosen for the carrier body.

Various techniques may be used to connect the carrier body 6 to the semiconductor body 1. Very favourable is a connection established by wringing, i.e. an optimized van der Waals connection (cf. for example European Patent No. EP 137537). A flow glass connection is also possible of the kind described in "Applied Physics Letters" 43, Aug. 1983, p. 263-265. A further possibility is impact diffusion, as described in European Patent No. EP 1219. Somewhat more complicated is the anodic connection step (see Journal of Applied Physics, 53, 1985, p. 1240).

The semiconductor body 1 is now made thin. This may be effected in a number of steps. Preferably, all these steps consist, but at any rate the last step consists, of a chemomechanical polishing operation and a stopping polishing treatment is carried out down to the layer 4 resistant to polishing. For this purpose, the aforementioned polishing agent may again be used. FIGS. 8 and 9 show a few steps.

FIG. 9 shows the "semiconductor on insulator". Due to the fact that the grooves are provided and stopping polishing is carried out down to the layer 4, mutually insulated semiconductor regions are obtained, of which the thickness is accurately determined. For example, integrated circuits may be provided in these regions.

The thickness of the semiconductor regions may be 0.1 to 3 μm for many applications. For example for power IC's, a larger thickness, for example 5 μm, is preferably chosen. These values are obtained automatically in the method according to the invention by the choice of the groove depth.

In a favourable embodiment, in which the layer 4 resistant to polishing consists of silicon nitride ($Si_3N_4$) and the chemomechanically polishable material consists of polycrystalline silicon, a layer of densified silicon dioxide may be provided between these layers in order to obtain an extraordinarily good electrical and chemical insulation, the silicon nitride acting as a very good chemical insulator and the silicon dioxide acting as a very good electrical insulator.

The "semiconductor on insulator" shown in FIG. 9 is particularly suitable to be used for forming a tridimensional stack of IC's. FIG. 10 shows an example thereof.

Integrated circuits are provided in the semiconductor layer 1 of the "semiconductor on insulator" formed, which is subdivided into individual regions. As a result, embossed parts are formed in this layer. The whole major surface is now provided with an electrically insulating layer, for example of silicon dioxide, and this layer is planarized. This body now serves as a carrier body, on which a second semiconductor body is placed.

The second semiconductor body may be formed in the manner indicated in FIG. 6. After this second semiconductor body has been connected to the "semiconductor on insulator" provided with a planarized layer, the semiconductor layer of the second semiconductor body is made thin. At any rate, the last processing step consists of stopping polishing.

Semiconductor structures may also be provided in this second semiconductor layer. If desired, further semiconductor bodies may be provided in order to obtain a tridimensional stack of IC's comprising a desired number of registers.

What is claimed is:

1. A method of manufacturing a semiconductor device of a "semiconductor on insulator" type comprising the steps of
    providing a monocrystalline semiconductor body with at least one flat optically smooth surface,
    forming a plurality of grooves in said flat smooth surface, said grooves having a predetermined depth,
    coating said surface having said grooves and coating said grooves with a first layer of material resistant to polishing,
    coating said first layer with a second layer of a chemomechanically polishable material, said second layer having a thickness greater than depths of said grooves,
    polishing said second layer down to said first layer at said flat smooth surface, said grooves with said first layer being filled with said chemomechanically polishable material of said second layer,
    forming a flat optically smooth surface of a carrier material, said optically smooth surface being provided with a layer of insulating material,
    joining said flat smooth surface of said carrier material to said first layer at said flat smooth surface on said semiconductor body, and
    polishing said semiconductor body at a side away from said carrier material down to said first layer of material resistant to polishing in said grooves, wherein semiconductor material of said semiconductor body remains between said plurality of grooves on said first layer, and wherein said second layer remains in said grooves surrounded by said first layer of material resistant to polishing and said layer of insulating material, and further comprising the steps of
    (a) forming IC structures in said semiconductor material remaining between said plurality of grooves,
    (b) depositing another layer of insulating material on said IC structures, (c) forming another layer of semiconductor material over said another layer of insulating material, said another layer of semiconductor material being interspersed with a further plurality of grooves, said another layer of semiconductor material having said first layer over a surface of said another layer of semiconductor material and on said further plurality of grooves and said second layer filling said further plurality of grooves, (d) forming another layer of IC structures in said another layer of semiconductor material between said further plurality of grooves in the same manner as said IC structures are formed in step (a), and (e) repeating steps (b) through (d) on said another layer of IC structures to form a tri-dimensional stack of IC's.

2. A method according to claim 1, wherein said first layer is silicon nitride.

3. A method according to claim 2, wherein said second layer consists of polycrystalline silicon.

4. A method according to claim 3, wherein a third layer of a densified silicon dioxide is provided between said first and second layers.

5. A method according to claim 1, wherein said first layer consists of densified silicon dioxide.

6. A method according to claim 1 or 5, wherein said second layer consists of polycrystalline silicon.

7. A method according to claim 1 or 2 or 5, wherein said second layer consists of an undensified silicon dioxide.

8. A method according to claim 1, wherein said layer of insulating material is formed with a thickness of 1 $\mu$m.

9. A method according to claim 1 or 1 wherein said layer of insulating material is thermally grown silicon dioxide.

10. A method according to claim 1 wherein said semiconductor material between said plurality of grooves is formed with a thickness ranging from about 0.1 to 3 $\mu$m.

11. A method according to claim 1 wherein said semiconductor material between said plurality of grooves is formed to a thickness of about 5 $\mu$m.

* * * * *